TRANSISTOR PARAMETRIC AMPLIFIER

Filed June 1, 1960

INVENTOR
JOHAN C. BALDER
EELTJE DE BOER
BY
AGENT 3,238,466

TRANSISTOR PARAMETRIC AMPLIFIER

Johan Cornelis Balder and Eeltje de Boer, Eindhoven, Netherlands, assignors to North American Philips Company, Inc., New York, N.Y., a corporation of Delaware Filed June 1, 1960, Ser. No. 33,242
Claims priority, application Germany, June 18, 1959, N 16,861
8 Claims. (Cl. 330—4.9)

The invention relates to a transistor amplifier for electric signal oscillations, in which an auxiliary oscillation source is connected in the collector circuit of the transistor. In a known circuit arrangement of this type, the signal oscillations are mixed with the auxiliary oscillation and the produced modulated oscillation is further used. The object of the invention is to supply an amplifier with which a higher amplification, and a better signal-to-noise ratio can be achieved. In particular, the oscillations of the signal frequency themselves produced in the collector circuit are used and not the modulated oscillations produced in this circuit.

The invention is characterized in that the collector circuit of the transistor is connected as a parametric amplifier by interconnecting an impedance which stores energy at least at the difference of the signal frequency and the auxiliary oscillation frequency.

In order that the invention may be readily carried into effect, it will now be described in greater detail by way of example with reference to the accompanying drawing.

Figures 1, 3:
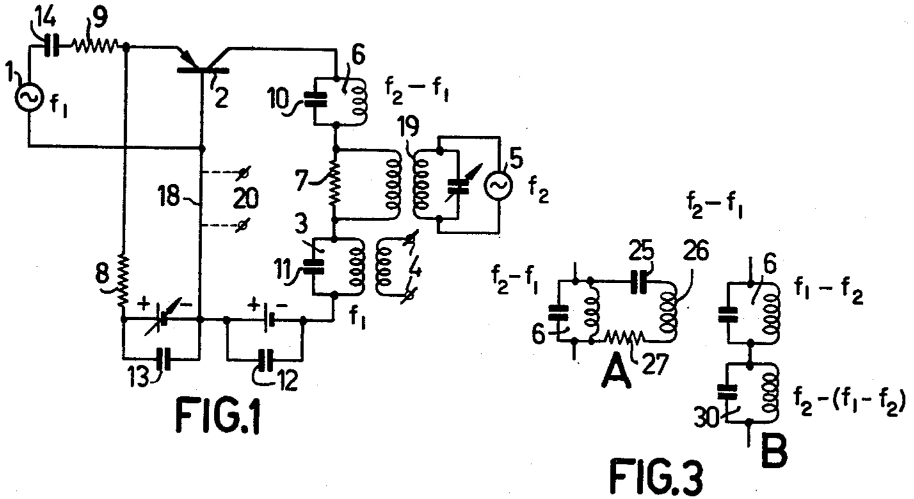
FIG. 1 is a circuit arrangement according to the invention.
FIG. 3 shows some variations of the impedance connected in the collector circuit of the transistor.

The amplifier as shown in FIG. 1 comprises a signal oscillation source 1 connected in the emitter circuit of a transistor 2. The amplified oscillations are produced via a parallel resonance circuit 3 tuned to these oscillations and connected in the collector circuit of the transistor and are supplied to the output terminals 4.

To obtain a higher amplification and a higher signal-to-noise ratio respectively, an auxiliary oscillation source 5 is connected, according to the invention, in the collector circuit of the transistor and this collector circuit comprises further an impedance 6 which absorbs energy at the difference of the signal frequency and the auxiliary oscillation frequency. The impedance 6 may, for example, be constructed as a parallel resonance circuit included in series in the collector circuit of the transistor 2 and tuned to the difference of the auxiliary oscillation frequency and the signal frequency.

The invention is based on the recognition that by this circuit arrangement the collector circuit of the transistor operates as a parametric amplifier. As is known, an internal capacitance dependent on the instantaneous value of the collector voltage is operative between collector and base (or, if the transistor is operated in emitter arrangement, between collector and emitter). The closed series arrangement of this internal capacitance which is dependent on the voltage, of the signal oscillation circuit 3, of the oscillator 5 and of the further impedance 6 consequently forms the conditions for a parametric amplification. Preferably, the peak voltage value of the auxiliary oscillation lies just below the supply voltage, in order that the internal capacitance of the collector is varied strongly but the arrangement still remains stable. As is known, this parametric amplification is attended with comparatively little noise, so that a larger signal-to-noise ratio can be achieved. In addition, the frequency characteristic of the amplification can be influenced considerably by suitable choice of the proportions of the impedance 6, for example a higher product of the band-width and of the amplification factor can be achieved. In this connection, it is also of importance that the steepness of the transistor is varied in the auxiliary oscillation rhythm by the feedback of the collector-base circuit on the emitter-base circuit, which results in stronger modulation components which, under circumstances, may contribute to increasing the parametric amplification.

Figure 2:
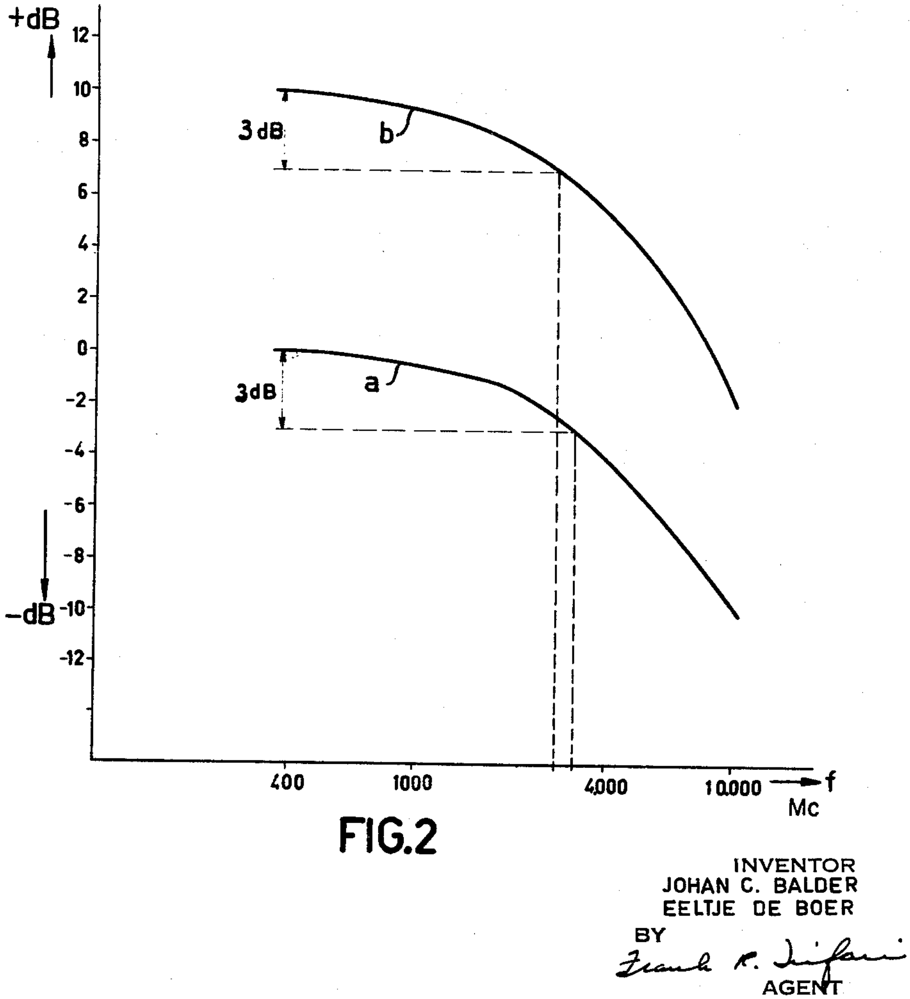
FIG. 2 shows amplification characteristics measured on an amplifier as shown in FIG. 1.

Curve *a* in FIG. 2 shows the amplification measured on a practical executional example as a function of the frequency deviation *f* of the medium frequency of the signal source 1, when the auxiliary oscillation source 5 is cut off, and hence transistor action provides the only amplification. By cutting in the auxiliary oscillation source 5, the amplification characteristic is measured as shown in curve *b* of FIG. 2. The source 1 supplied a signal of 2.6 mc./s., the auxiliary oscillation source 5 a frequency of 25 mc./s., the circuits 3 and 6 were tuned to 2.6 mc./s. and 22.4 mc./s. respectively, and the factors of merit of these circuits were each 180, the resistors 7, 8 and 9 were 50Ω, 10KΩ and 75Ω, the capacitors 10 and 14 were 55 pf., 82 pf., 10,000 pf. and 0.1 μf., the collector supply voltage was —4 v., the emitter-collector current was adjusted to 1 ma. by the emitter supply source. The auxiliary oscillation produced across the resistor 7 had a peak value of 3.7 v. The transistor 2 was of the type OC 171.

Without leaving the scope of the invention, the circuit arrangement as shown in FIG. 1 may be varied in many manners. For example, the auxiliary oscillation source 5 may be omitted if the transistor 2 is arranged as a self-oscillating arrangement for this auxiliary frequency. For this purpose, the lead 18 is interrupted, for example, and the circuit 19 tuned to this auxiliary frequency is not connected to the auxiliary source 5 but to the terminals 20, so that a regenerative collector-base feedback takes place.

The transistor 2 may also be operated in emitter arrangement instead of in base arrangement. As is known, a higher frequency range is made possible by the base arrangement and the reaction of output circuit on input circuit is decreased.

To obtain a higher band-width, the impedance 6 may be rather complicated. It is not absolutely necessary for this impedance to come into resonance at the difference of the auxiliary frequency and the signal frequency, but incorrect tuning is admissible. It is of particular importance that the phase characteristic of this impedance which, in the case of a normal parallel resonance circuit, is leading at frequencies lower than the resonance frequency and is lagging at higher frequencies; shows a weak or even an opposite course in the neighbourhood of the difference frequency in question.

A simple method to achieve these properties is shown in FIG. 3(*a*). Parallel to the parallel resonance circuit 6 which is tuned to the difference frequency, a damped series resonance circuit 25, 26, 27 is arranged which is also tuned to this difference frequency. By suitable proportioning of the circuit 25, 26, 27, the desired phase variations can be achieved.

As is known from experiments on parametric amplifiers, it is not necessary either for the signal frequency to be lower invariably than the auxiliary frequency. The circuit 6 is then again tuned to the difference of the signal frequency and the auxiliary oscillation frequency, and a further parallel resonance circuit 30 (FIG. 3(*b*)) which is tuned to the difference of the auxiliary oscillation frequency and the resonance frequency of the circuit 6, is connected in series with this circuit 6 in the collector circuit of the transistor 2. In other words, the circuit 30 is tuned to the difference between the signal frequency and twice the auxiliary oscillation frequency.

What is claimed is:

1. A parametric transistor amplifier comprising a transistor having input, common and collector electrodes, a signal frequency source connected between said input and common electrodes, a pump source of frequency higher than said signal frequency connected between said common electrode and at least one of said other electrodes, an idler parallel resonant circuit tuned to the difference between said pump and signal frequencies connected between said common electrode and one of said other electrodes, and an output circuit connected between the collector electrode and said common electrode for obtaining the parametrically amplified signal frequency.

2. A parametric transistor amplifier comprising a transistor having input, common, and collector electrodes, a source of signal oscillations, means for connecting said source of signal oscillations between said input and common electrodes, a series circuit connected between said collector and common electrodes comprising first, second and third impedance means, means for obtaining output signals of the frequency of said signal oscillations from said first impedance means, and means for introducing pump oscillations across said second impedance means, said third impedance means comprising parallel resonant circuit means for storing energy at the idler frequency.

3. A parametric transistor amplifier comprising a transistor having input, common, and collector electrodes, a source of signal oscillations, means for connecting said source between said input and common electrodes, an output circuit connected to said collector electrode comprising a first resonant circuit tuned to the frequency of said signal oscillations, whereby amplified signal oscillations occur across said first resonant circuit, and means for further amplifying the signals appearing across said first resonant circuit by parametric amplification comprising means for applying pump oscillations to said collector circuit, whereby pump and signal oscillations are mixed in the collector-common electrode capacitance of said transistor to produce idler oscillations, and second resonant circuit means connected serially in said output circuit and tuned to the frequency of said idler oscillations.

4. A parametric transistor amplifier comprising a transistor having input, common, and collector electrodes, a source of signal oscillations, means for connecting said source between said common and input electrodes, a series output circuit connected between said collector and common electrodes comprising output resonant circuit means tuned to the frequency of said signal oscillations, means for introducing pump oscillations into said output circuit, and idler resonant circuit means tuned to the difference frequency of said pump and signal oscillations.

5. The amplifier of claim 4 wherein said means for introducing said pump oscillations comprises regenerative feedback means connected to said transistor whereby said transistor oscillates at the frequency of said pump oscillations.

6. The amplifier of claim 4 wherein said idler resonant circuit means comprises a parallel resonant circuit tuned to said idler frequency, and a damped series resonant circuit connected in parallel with said parallel resonant circuit and tuned to said idler frequency.

7. A parametric transistor amplifier comprising a transistor having base, emitter, and collector electrodes, a source of signal oscillations connected between said emitter and base electrodes, output circuit means connected between said collector and base electrodes comprising a first parallel resonant circuit tuned to the frequency of said signal oscillations, impedance means, means for producing pump oscillations across said impedance means, and second parallel resonant circuit means tuned to the difference frequency of said pump and signal oscillations.

8. The amplifier of claim 7 wherein said pump oscillations have a lower frequency than said signal oscillations, comprising a third resonant circuit connected in said output circuit and tuned to the difference frequency of said signal oscillations and twice said pump oscillations.

References Cited by the Examiner

UNITED STATES PATENTS 2,838,687 6/1958 Clary ---------------- 330—5

FOREIGN PATENTS 206,022 11/1959 Austria.

ROY LAKE, *Primary Examiner.*

ELI SAX, BENNETT G. MILLER, *Examiners.*